United States Patent [19]

Solt, Jr.

[11] Patent Number: 4,558,426

[45] Date of Patent: Dec. 10, 1985

[54] TRANSDUCER MULTIPLEXER

[75] Inventor: Clarence R. Solt, Jr., Gardena, Calif.

[73] Assignee: McDonnell Douglas Corporation, Long Beach, Calif.

[21] Appl. No.: 561,307

[22] Filed: Dec. 14, 1983

[51] Int. Cl.$^4$ ............................................. G06F 11/00
[52] U.S. Cl. .................................... 364/580; 364/483; 364/571
[58] Field of Search ............... 364/580, 579, 550, 551, 364/571, 481, 482, 483

[56] References Cited

U.S. PATENT DOCUMENTS

| | | | |
|---|---|---|---|
| 4,192,005 | 3/1980 | Kurtz | 364/558 X |
| 4,255,792 | 3/1981 | Das | 364/580 |
| 4,351,031 | 9/1982 | Flaherty et al. | 364/580 |
| 4,397,021 | 8/1983 | Lloyd et al. | 364/580 X |
| 4,402,055 | 8/1983 | Lloyd et al. | 364/580 X |
| 4,437,164 | 3/1984 | Branch, III | 364/571 |

*Primary Examiner*—Edward J. Wise
*Attorney, Agent, or Firm*—Gregory A. Cone; George W. Finch; Donald L. Royer

[57] ABSTRACT

This transducer multiplexer enables a multiplicity of individual bridge type transducers to be calibrated simultaneously under computer control. The various transducers are connected to a common loading means capable of providing a variety of known loads to the transducers also under computer control. The transducer multiplexer communicates with an external control computer over a standard interface bus. The microprocessor in the transducer multiplexer interprets and executes the commands, received over the interface bus, to perform one of the following tasks: (a) calibration resistor selection means; (b) bridge leg selection means which select one of the legs of one of the transducers to which the selected calibration resistor is applied in parallel; or (c) channel selection means which select one of the transducers for testing and calibration in conjunction with the loading means or in conjunction with the calibration resistor and bridge leg selection means, and output means providing signals representing the response to the transducers.

Manual control of these functions is also provided through lighted pushbutton switches on the front panel.

9 Claims, 10 Drawing Figures

TRANSDUCER MULTIPLEXER

A computer program useful for the practice of this invention apprears as an appendix to this specification and consists of one sheet of microfiche which contains eleven frames of code listing.

BACKGROUND OF THE INVENTION

This invention relates to testing equipment for bridge type transducers. More particularly, this invention relates to semi-automated testing systems for bridge type transducers and have the capability to test several transducers at once. The word "transducer" is meant to include any full bridge measuring device, e.g., pressure transducers, load cells, accelerometers, etc.

Prior art methods of testing and calibrating bridge type transducers have been done by manual testing of one transducer at a time. The normal calibration procedure for a bridge type transducer is to apply about twenty known load levels onto the transducer and then measure the output voltage of the transducer at each of these known load levels. This then provides a listing of load levels versus the ratio of the output voltage to the input voltage of the transducer. Normally this is expressed not as the curve of the individual points but rather a best fit linear curve specified by a slope and an intercept. Once the calibrated transducer is sent to the field, it then becomes very inconvenient to retest the transducer by the former method. A field check of the transducer may be accomplished by applying a calibration resistor of known resistance in parallel to one of the bridge leg resistors in the transducer. This would also have been done at the time of the lab calibration using the twenty known load levels. The lab testing would then apply the particular calibration resistor of known resistance across a specified leg of the transducer and record a reading which would represent at least 50% of the full scale loading of the transducer. In other words, the calibration resistor simulates a load, although no load is actually applied to the transducer. A field operator would then check the functioning of the transducer by connecting the same known calibration resistance across the same leg to check that the output at that time agreed with the lab recorded calibration resistor output. If the two readings match, this verifies the full range calibration of the bridge type transducer.

Unfortunately, the manual testing process is quite tedious and, therefore, prone to human error. It is common for mistakes to be made in the recording of which leg of the transducer is used for the calibraton resistor test. Another common error is recording the value of the cal resistor used. These problems are aggravated in a testing lab since it is quite common to receive a large number of transducers all at once. There has been an unmet need in the testing industry for an automated system which can produce error free calibration of large numbers of transducers simultaneously.

SUMMARY OF THE INVENTION

This transducer multiplexer controls the testing and calibration of a multiplicity of bridge type transducers which are connected to a loading means capable of applying a variety of known loads to the transducers. The transducer multiplexer is under the control of a separate computer and is connected thereto by a bus. The transducer multiplexer provides output signals from the transducers to a separate precision volt meter. The transducer multiplexer communicates to an external control computer through a standard interface bus. The microprocessor, internal to the transducer multiplexer, accepts, interprets and executes the commands received over the bus. Under program control, these commands perform the following functions: select a channel, select a bridge leg, and/or select a calibration resistor. The microprocessor also communicates with RAM for temporary storage of system information and with ROM which holds the operating program. Once the channel, bridge leg and/or calibration resistor have been selected, the signals from the transducer are then passed through the transducer multiplexer to a precision voltmeter. The calibration can then proceed until different reset conditions are required on the transducer multiplexer.

DETAILED DESCRIPTION OF THE INVENTION

A preferred embodiment of the transducer multiplexer system that constitutes this invention was developed to test eight bridge type pressure transducers in a single batch. Of course, the invention is not necessarily limited to pressure transducers per se, or to devices which only handle eight transducers at a time. The true scope of the invention will be defined by the appended claims. This particular pressure transducer multiplexer was developed in part to be able to communicate with a standard bus commonly used between intelligent instruments. This is the bus defined by the IEEE-488 bus specification standard. This bus allows for communication between the master system controller which is a separate computer and the other elements of the overall testing system. These other elements include a precision digital volt meter, the transducer multiplexer itself, a pressure manifold, and a pressure controller.

Figure 1:
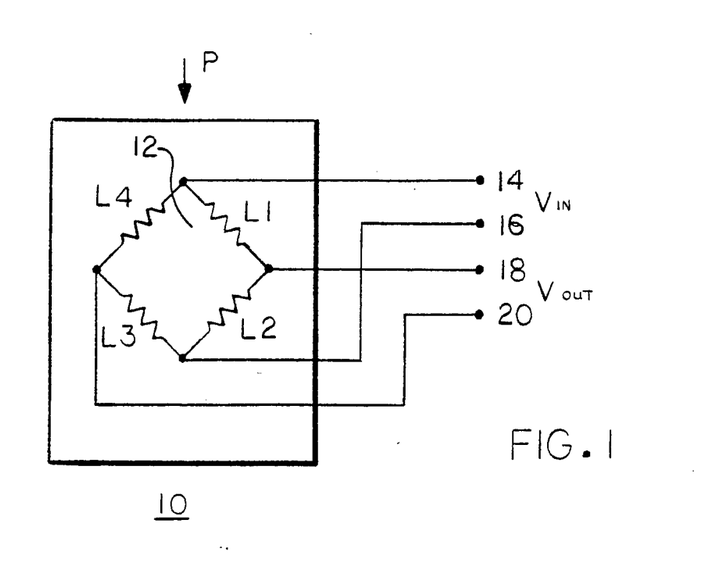
FIG. 1 is a schematic diagram of an individual bridge type transducer.

Turning to the drawings, FIG. 1 is a block diagram showing the internal functional components of a typical bridge type pressure transducer. The transducer 10 houses a bridge of four resistor elements. These elements are defined as the four legs, L1, L2, L3, and L4, of the bridge 12. When a pressure load P is placed on the transducer 10, an output voltage is measured between terminals 18 and 20 as shown. At the same time an input voltage is placed across terminals 14 and 16 as shown. Of course, the operating principal involved is that as the legs of the bridge 12 are loaded, the resistance in the various legs changes by a measurable amount which correlates to the magnitude of the load. When a calibration resistor, $R_{cal}$, is placed across two of the terminals, the parallel connection of the calibration resistor will mimic a known load upon the transducer 10 and will provide a known output between terminals 18 and 20 which can be checked against the calibrated specification for the particular transducer.

Figure 2:
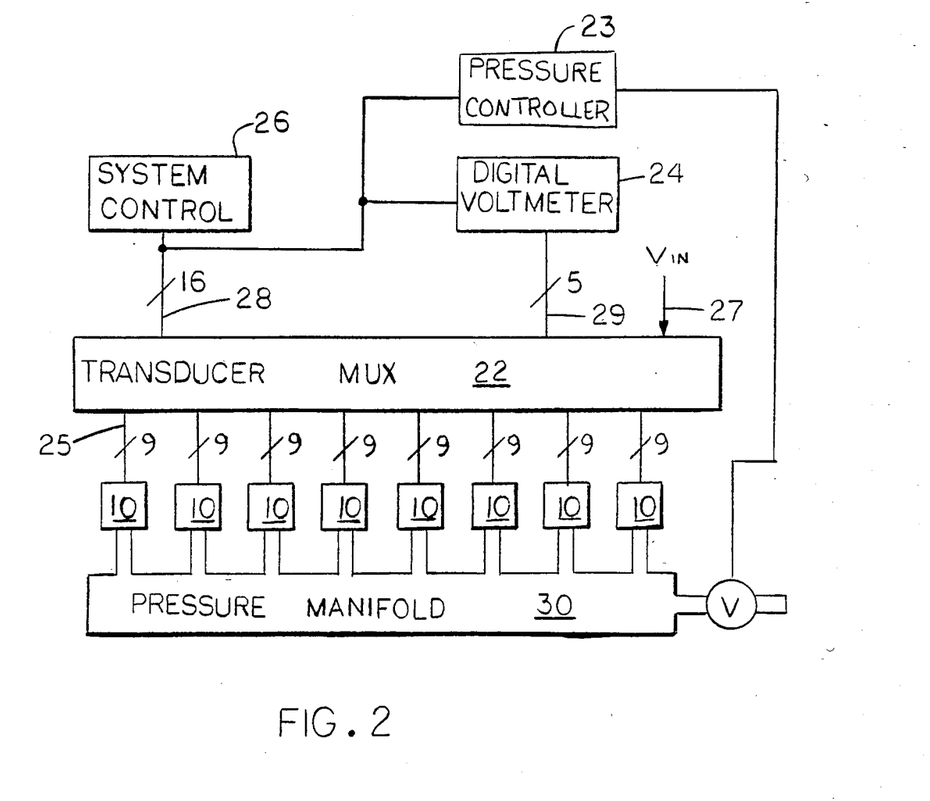
FIG. 2 is a simplified block diagram of the various elements of the overall transducer testing system of which the transducer multiplexer forms a part.

FIG. 2 shows an overall view of the entire system used for calibrating and testing the pressure transducers. The overall system is controlled by a system control or computer 26, normally equipped with a keyboard or other user input means. The system control sends commands to the transducer multiplexer 22 over the IEEE-488 bus labeled 28. This is a 16 line bus as indicated in the figure. Input voltage for the transducers under test is suppllied to the transducer multiplexer 22 over a power line 27. In this embodiment, eight individual pressure transducers 10 are linked to the transducer multiplexer 22 by the eight 9-line cable bundles, the leftmost of which is labeled 25. The individual transducers 10 are in turn operably connected to a pressure manifold 30 by which a series of known pressure loads may be placed upon the individual transducers 10. The known loads are controlled by a pressure controller 23 which receives commands over the bus 28 and in turn regulates the pressure in the manifold 30. Suitably identified outputs from the individual transducers 10 are supplied to the digital volt meter 24 via the transducer multiplexer over the 5-wire cable labeled 29. The digital volt meter is in turn connected to the system control as shown.

Figure 3:
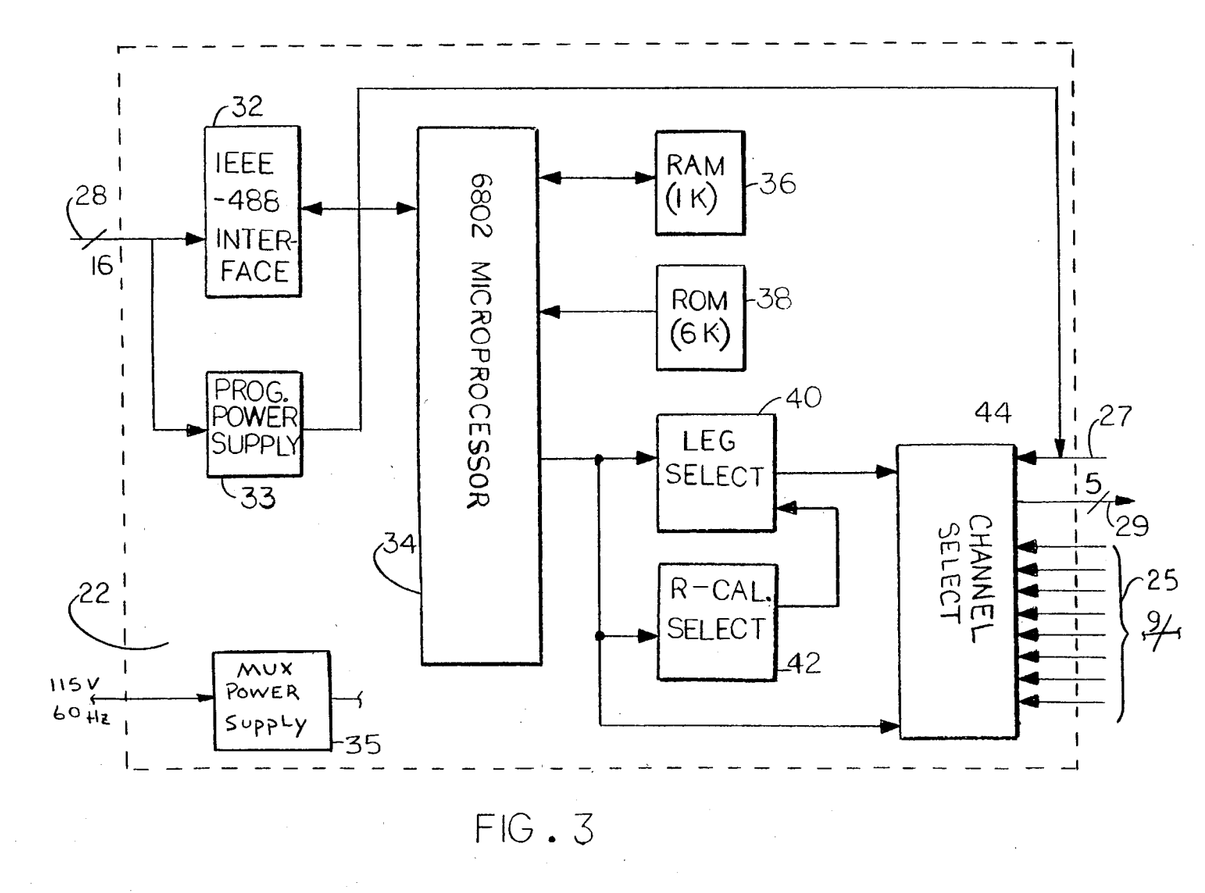
FIG. 3 is a simplified block diagram of the transducer multiplexer portion of the testing system.

FIG. 3 is a simplified schematic diagram of the functional elements of the transducer multiplexer itself. The transducer multiplexer 22 receives its commands over the IEEE-488 bus, shown here as the 16-wire cable labeled 28. The bus information is translated by the IEEE-488 interface block 32. Two power supplies are shown, 33 and 35. The transducer multiplexer power supply 35 is a standard modular power supply which converts 115 VAC to the various DC voltages needed for the operation of the various chips, relays, LED's, etc. The programmable power supply 33 is an optional element which provides a capability for internally supplying input voltage to the individual transducers under control of the IEEE-488 bus. It supplements the external voltage supplied over line 27. The bus interface block 32 communicates with the 6802 microprocessor shown as block 34. The microprocessor in turn communicates with its RAM memory 36, the ROM memory 38 which contains the system operating program, and transmits commands to the bridge leg selection block 40, the calibration resistor selection block 42, and the channel selection block 44. Also shown in this figure are the output to the digital voltmeter labeled 29 and the 9-wire bundles labeled 25 which go out to each of the transducers.

Figure 4:
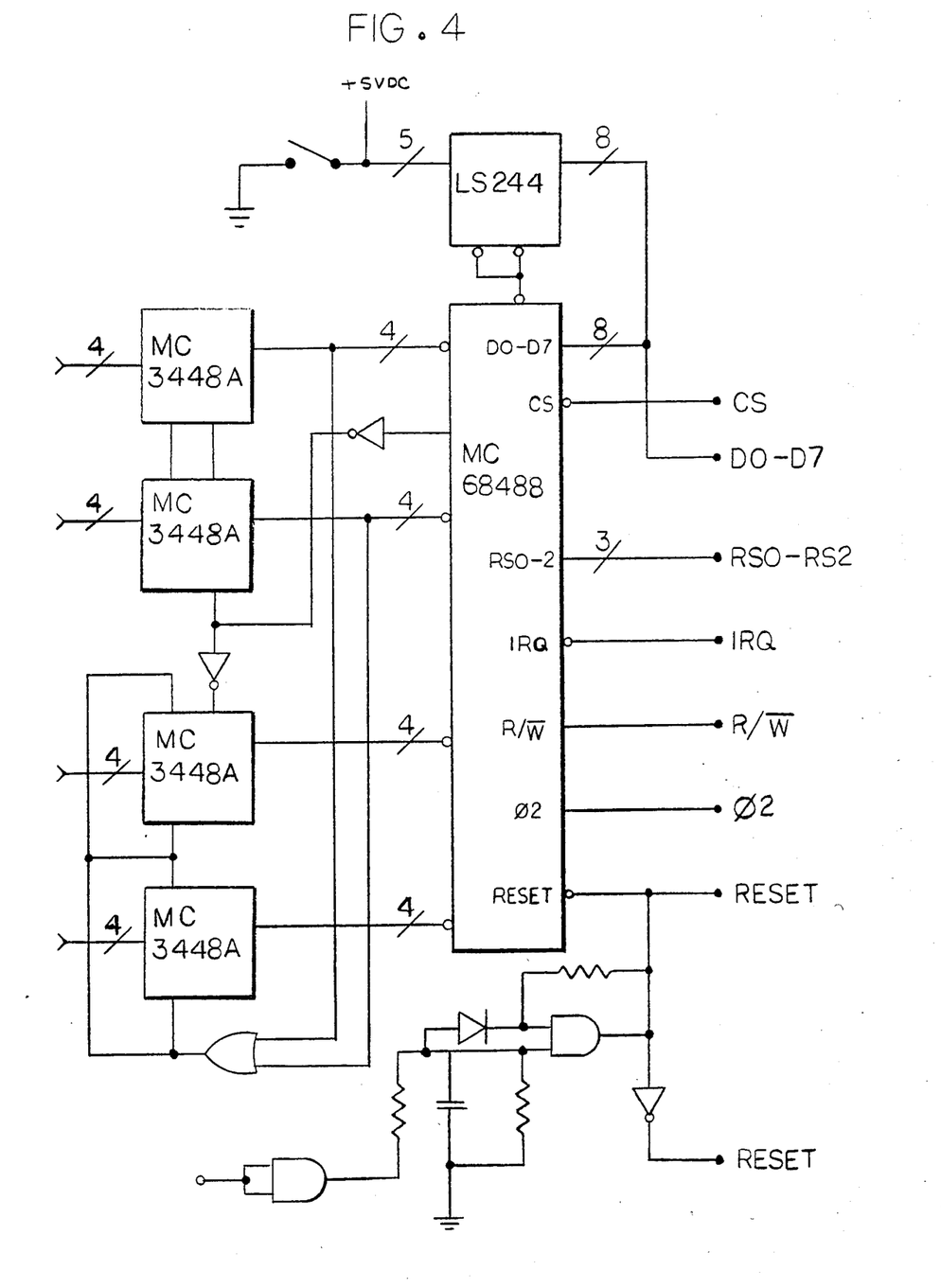
FIG. 4 is a schematic diagram of the bus interface portion of the transducer multiplexer.

FIG. 4 is a schematic diagram of the bus interface and the power on reset portions of the transducer multiplexer. The power on reset portion is found at the bottom portion of the figure and comprises the two AND gates (LS08) an inverter (LS04) and the three resistors, one capacitor, and one diode as shown. The function of this power on reset circuit is to reset the system to its starting conditions; that is, the latches are cleared, the interfaces are cleared, and the system operating program is reinitialized to its first instruction when the reset output is produced. The main part of this figure is devoted to the IEEE-488 interface. This circuit comprises five switches connected to the LS244 buffer, the main interface controller chip (MC68488), four bus driver chips (MC3448A), two inverters (LS04), and an OR gate (LS32). The function of this circuit is to provide electrical compatibility with the IEEE-488 bus as described in the IEEE-488-1978 specification. The MC68488 interface controller provides the intelligence to handle the 488 bus timing and make available to the microprocessor (shown in FIG. 5) the data required for further interpretation by the system operating program. It also provides bus control as dictated by the program. The MC3448A chips provide the electrical drive capability for the 488 bus. The five switches provide device address entry. These addresses are buffered to the microprocessor data bus and stored in the MC68488 under program control. The inputs to the bus interface circuit are the four 4-wire bundles comprising the 488 bus which input to the four MC3448A chips and the five switched inputs to the LS244 buffer. The outputs are as shown on the right side of the figure. This circuit implementation is rather straightforward, and any connections which are not shown are self evident to one skilled in the art.

Figure 5:
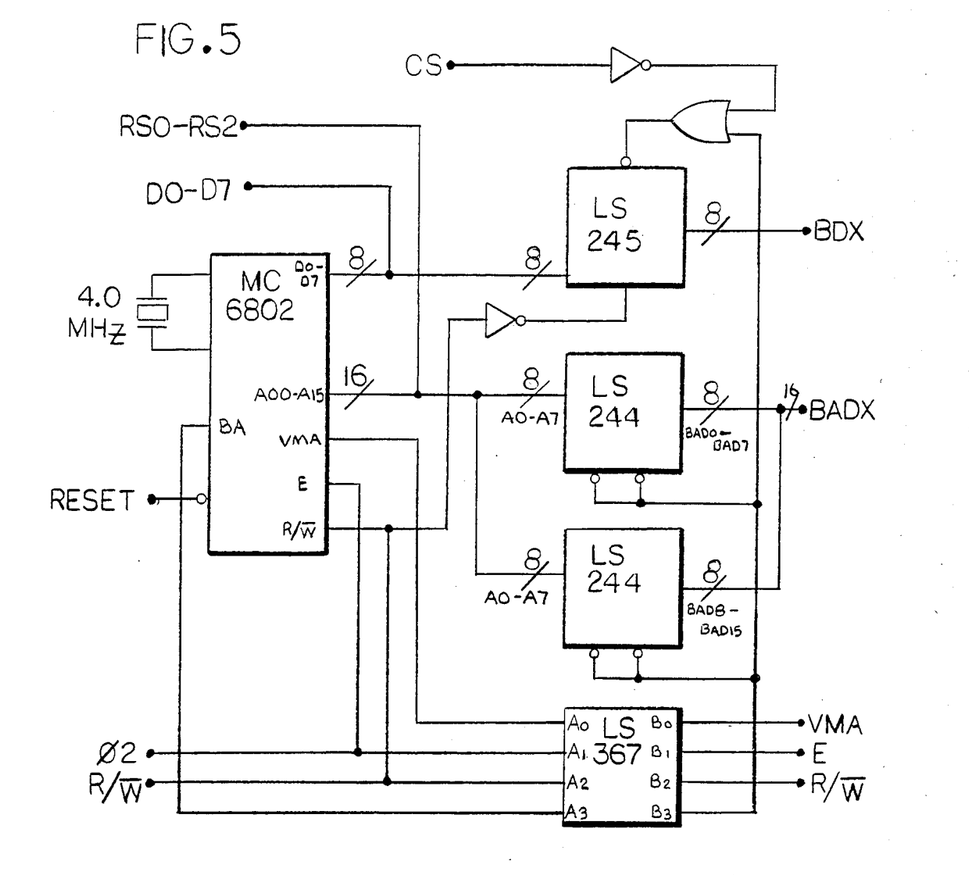
FIG. 5 is a schematic diagram of the microprocessor portion of the transducer multiplexer.

FIG. 5 is a schematic diagram of the microprocessor section of the transducer multiplexer. The inputs to the microprocessor are generally as shown on the left portion of the figure. The microprocessor itself is the MC6802 chip. Also included are a data bus buffer chip (LS245), an address bus buffer section consisting of two LS244 chips, a control bus buffer (an LS367 chip), and associated gating. The function of this circuit is to fetch, store and/or interpret data. The address bus, the 16-line bus labeled A00–A15 at the MC6802 chip, outputs the location to or from which data is to be transferred. The data bus, the 8-line bus labeled D0–D7 between the MC6802 chip and the LS 245 chip, carries the data to or from the addressed location. The control bus provides the timing to synchronize the data transfer. The buffers provide the electrical drive capability to handle all the devices connected to that bus. The outputs from this circuit are then the data bus output (BDX), the address bus (BADX), and the control bus signals as shown.

Figure 6:
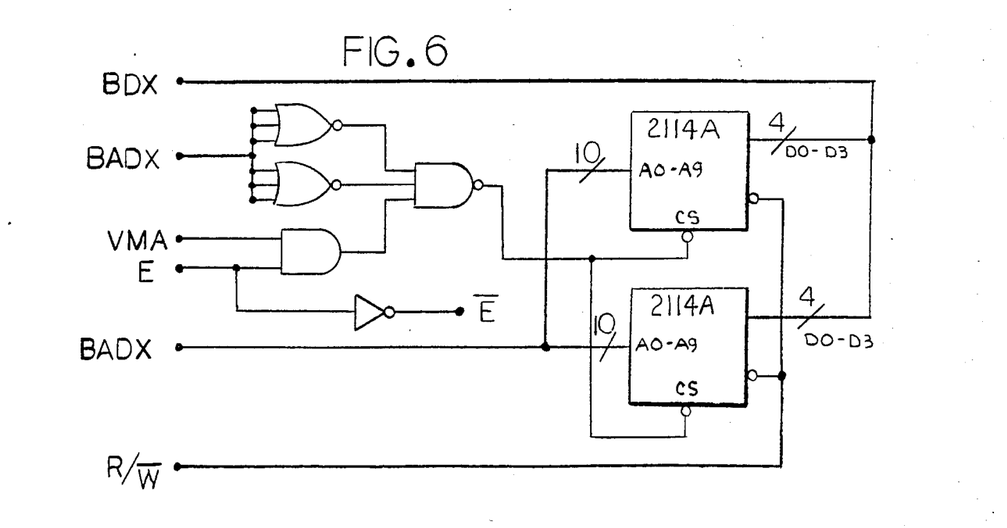
FIG. 6 is a schematic diagram of the RAM portion of the transducer multiplexer.

FIG. 6 shows the random access memory portion of the transducer multiplexer. Basically it serves to provide 1K bytes of temporary data storage for the microprocessor section. It consists of a pair of ROM chips (2114A) and address decoding logic as shown.

Figure 7:
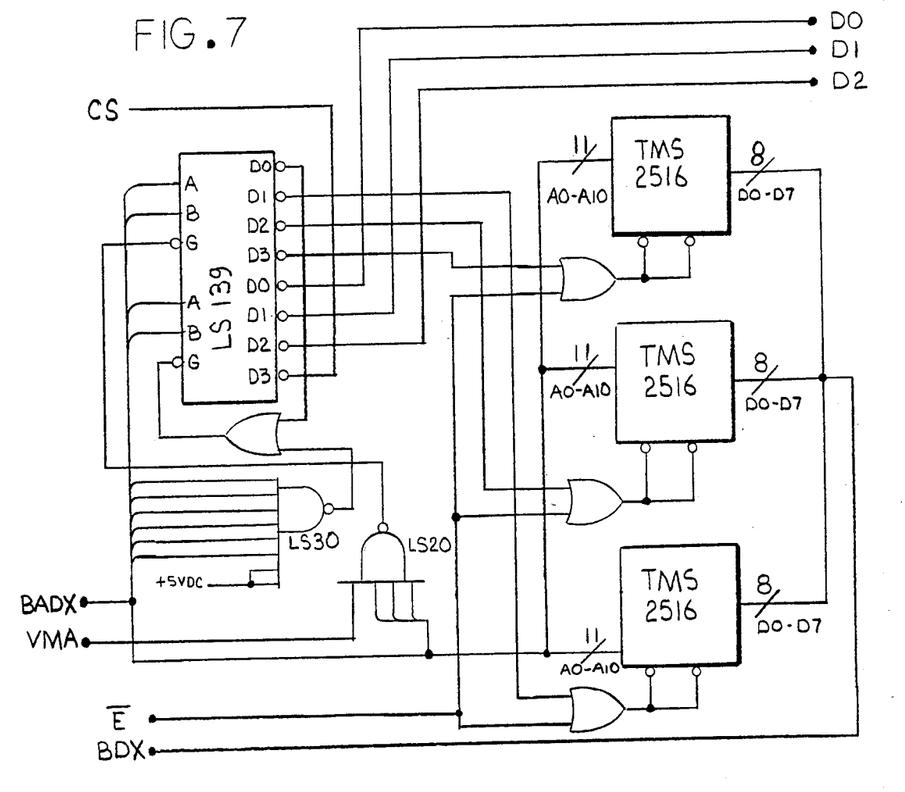
FIG. 7 is a schematic diagram of the ROM portion of the transducer multiplexer.

FIG. 7 is a schematic diagram showing the read only memory section of the transducer multiplexer. This section provides 6K bytes of permanent data storage. This represents the storage location for the system operating program for the transducer multiplexer. This circuit consists of three ROM's (TMS2516) and address decoding done by the LS139 chip and its associated logic gating as shown. The three output lines, D0, D1 and D2, are address decoding for FIG. 8. D0 enables the channel select decoder, D1 enables the R-Cal select decoder, and D2 enables the front panel switch scanner.

Figure 8:
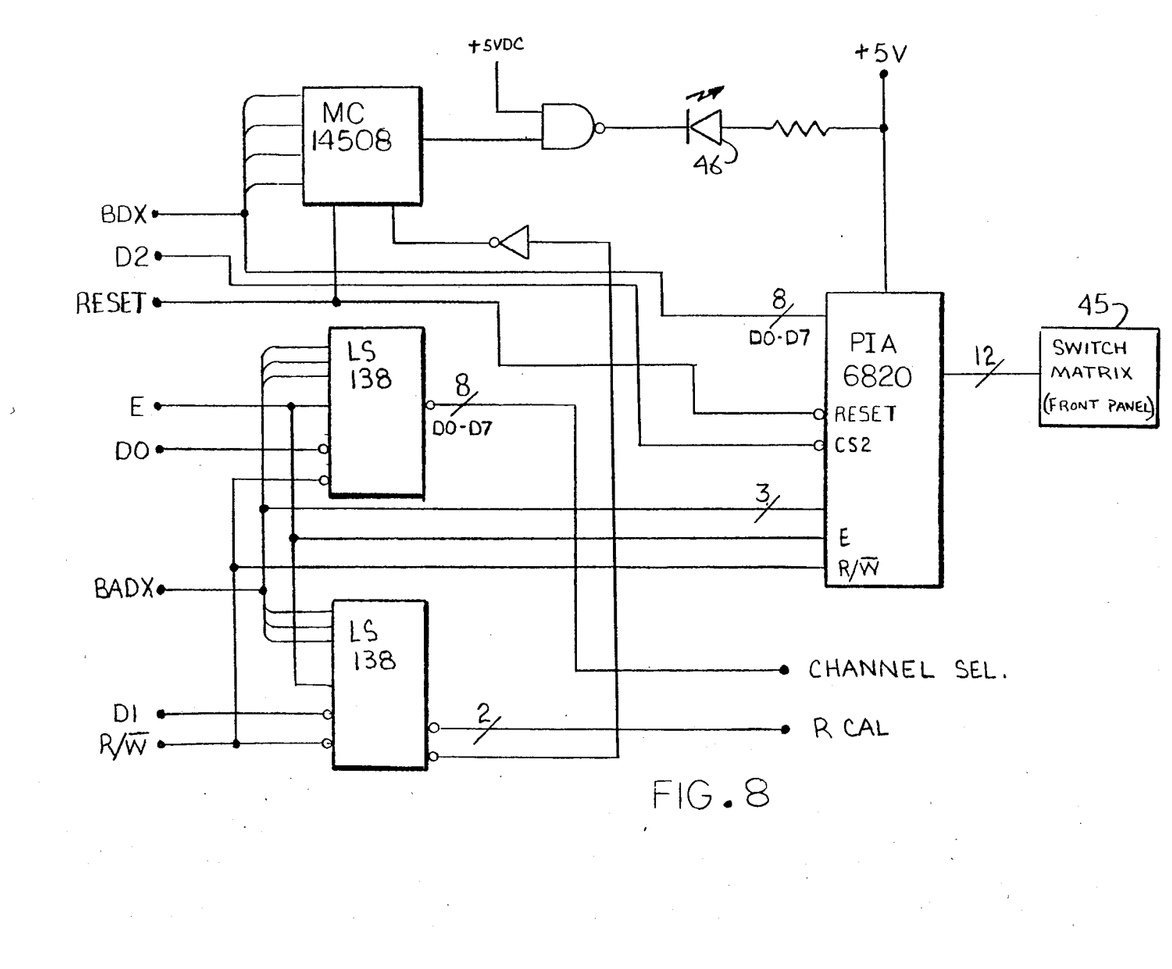
FIG. 8 is a schematic diagram of the address decoding and manual control portions of the transducer multiplexer.

FIG. 8 is a schematic diagram of the address decoding section of the transducer multiplexer. This circuit consists of two, one of eight decoders (LS138) and a one of four decoder (half of the LS139 chip located in the ROM circuit in FIG. 7 which provides the D0, D1 and D2 outputs). The 00, 01 and 02 lines of the BADX bus are connected to the A, B, and C inputs respectively of the LS138 chips. The enable input (E) is connected to the G1 input of the LS138 chips. The D0 and D1 inputs are connected to the G2A inputs on the LS138 chips. And the READ/NOT WRITE signal lines are connected to the G2B inputs of the LS138 chips. The 8-bit output of the upper LS138 chip provides control information to the channel selection circuits shown in FIG. 10. The two bit output from the lower LS138 chip provides command information for the calibration resistor selection circuit shown in FIG. 9. The remainder of this circuit is a switch matrix 45 which provides a capability for manual control by the operator. Normally, the transducer multiplexer will be controlled by the 488 bus; however, manual control is often advantageous under certain conditions. The circuit consists of lighted momentary pushbutton switches which are controlled by the 12-bit output line from the PIA(MC6820) chip. Once the manual mode is in effect, a switch closure is detected through the buffer which is under program control. However, this circuit will be disabled if the 488 bus is controlling the system. The channel, bridge leg or calibration resistor circuit corresponding to a particular switch closure is energized. Confirmation of the operator's selection is displayed on the front panel by lighting the LED integral to each pushbutton switch. The latch (MC14508) provides for ON/OFF control of the REMOTE LED 46. When on, it indicates that the transducer multiplexer is under remote control through the IEEE-488 bus. When off, it indicates that the transducer multiplexer can be controlled manually through the front panel pushbuttons.

Figure 9:
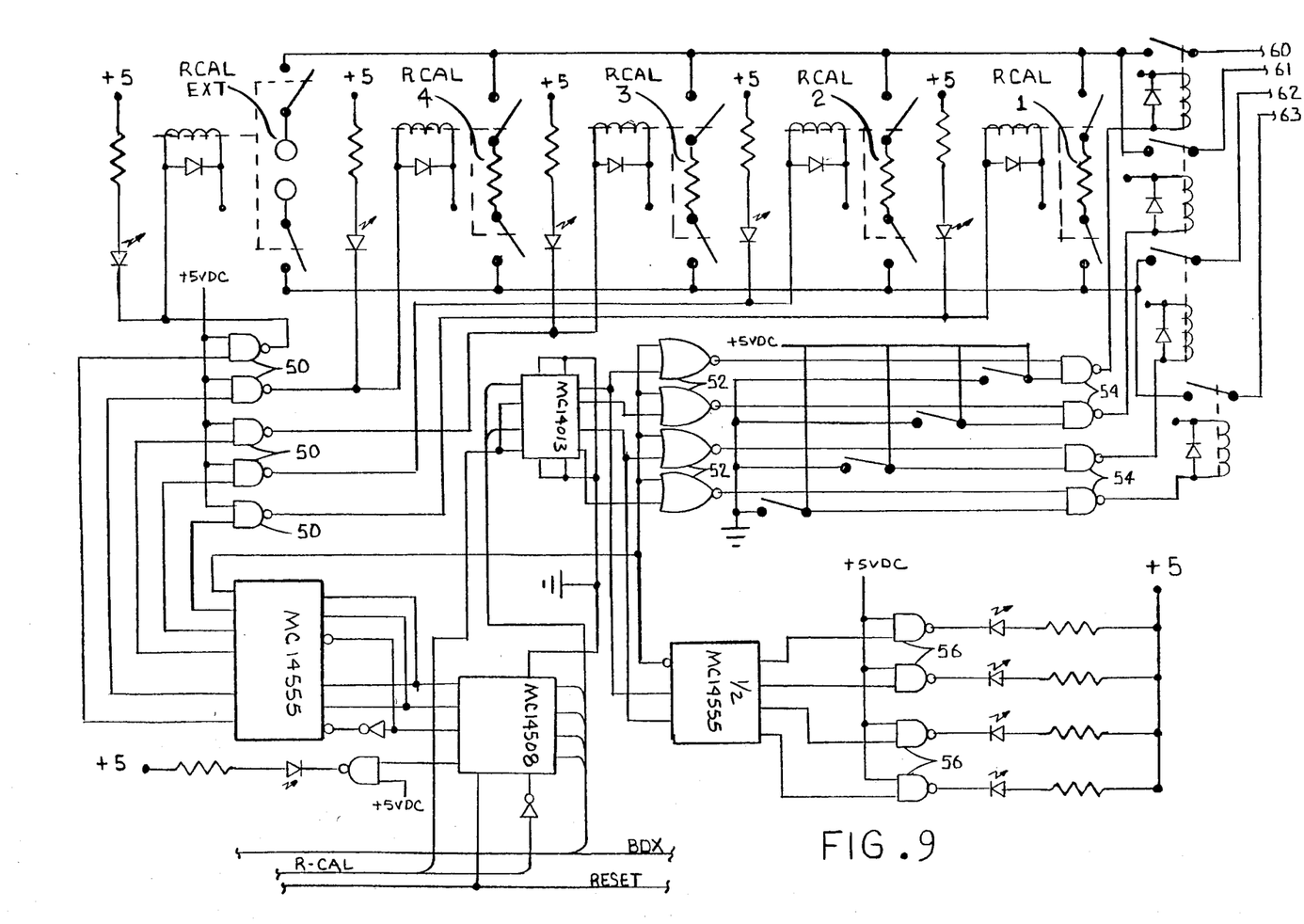
FIG. 9 is a schematic diagram of both the calibration resistor selection portion and the bridge leg selection portion of the transducer multiplexer.

FIG. 9 shows the calibration resistor selection and bridge leg selection portions of the transducer multiplexer. The calibration resistor selection portion consists of a latch (half of an MC14508), a dual one of four decoder (MC14555), relay drivers 50 (DS8636), five relays (double pole-single throw), and light emitting diodes as shown. Its function is to select one of the four fixed value calibration resistors (RCAL1-4) or the external jacks for a user-selected calibration resistor (RCAL EXT). The latch stores the data received over the BDX line which is then decoded by the MC14555 decoder, so that one of the five relays is selected. The appropriate relay driver is turned on, closing the relay and lighting the LED which is on the front panel of the transducer multiplexer, giving the user a visual indication of the selected calibration resistor. The bridge leg selection portion of the circuit consists of a latch (MC14013, a one of four decoder), half of an MC14555, relay drivers 54 (DS8636), four relays (DPST), light emitting diodes, NOR gates 52 (MC14001), and resistors as shown. The bridge leg selection circuit selects one of the four legs of the bridge across which the selected RCAL will be connected. The latch stores the data received from the BDX line which enables two of the four relays to be energized, one for each side of the leg. A one of four decoder decodes the latched data and lights the appropriate LED to display the leg selection to the operator. If no RCAL is selected, the circuit is disabled until an RCAL is selected. The relay contacts on an input to the relay drivers provide a break-before-make function for the leg selection relays. The outputs from these combined circuits are transmitted over output lines 60, 61, 62 and 63.

Figure 10:
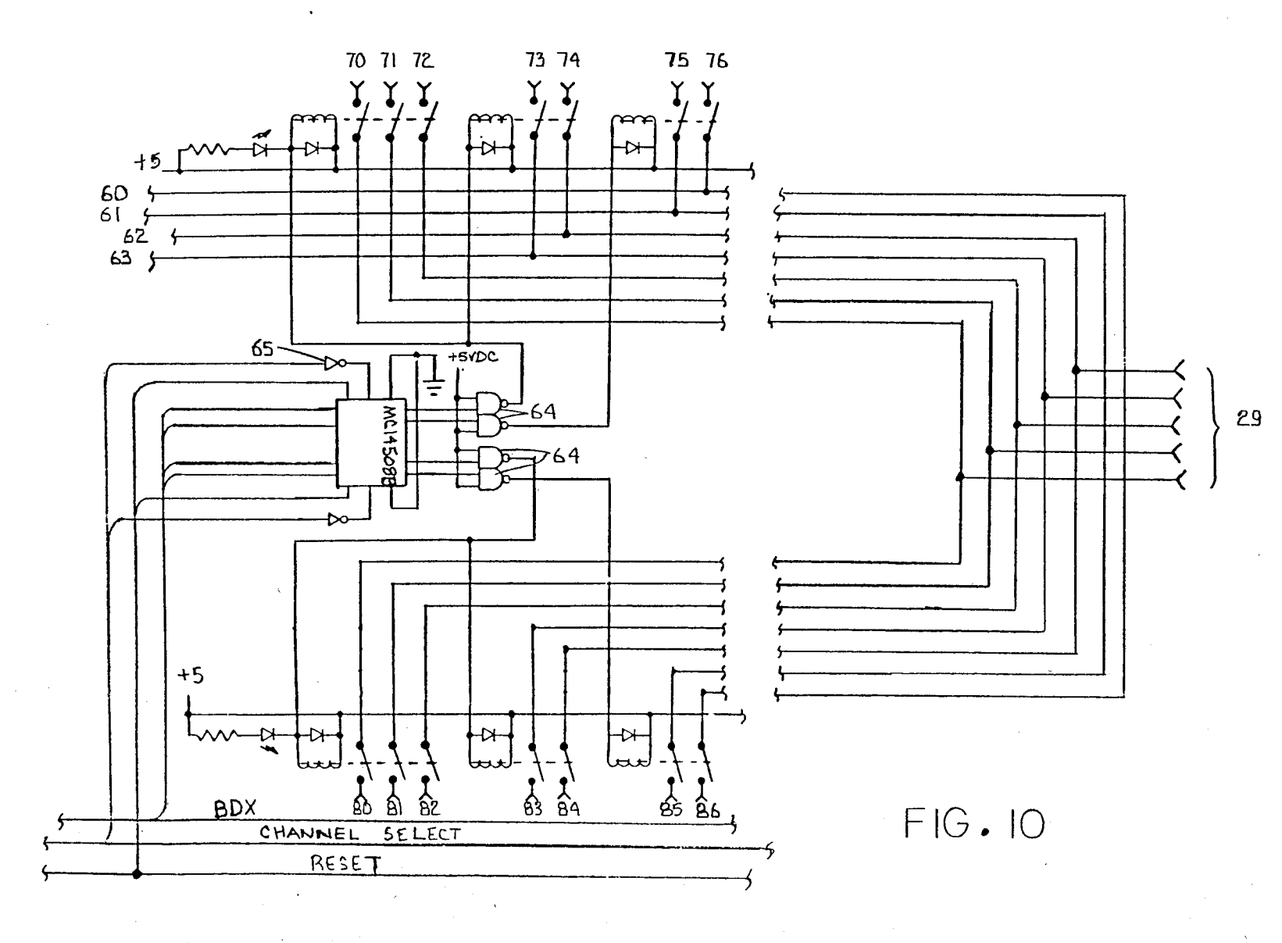
FIG. 10 is a schematic diagram of the channel selection portion of the transducer multiplexer.

FIG. 10 is a partial schematic drawing of the channel selection portion of the transducer multiplexer. There are eight channels in this particular embodiment of the transducer multiplexer and only two are shown here, one in the upper half of the left portion of this figure and the other in the lower half of this same portion. A single channel selection circuit consists of a latch (half of an MC14508) an inverter 65 (MC14069), a pair of relay drivers 64 (DS8636), three relays (one three-pole single throw and two double pole-single throw as shown) and an LED for each channel. The function of each channel selection circuit is to energize the appropriate relays to allow the bridge signals over lines 70, 71, 72 and 73 and 74 to be transferred to the output connector 29. The latch stores the data which allows the relays to be energized. The three pole relay (70, 71, 72) and a two pole relay (73, 74) are energized whenever that channel is selected, allowing the reference voltage and the signal voltage of the bridge to be output to the voltmeter over lines 29. The LED is also turned on to provide front panel indication to the operator of the channel selected. The second two pull relay is energized when an RCAL resistor is selected, allowing the RCAL from 60, 61, 62, 63 to be connected to the bridge. The organization of the lower channel is identical with the connectors being labeled 80-86 in a similar fashion.

What is claimed is:

1. A transducer multiplexer device for controlling the testing of a multiplicity of bridge type transducers connected to loading means capable of applying a variety of known loads to the transducers, the device being under the control of a separate operator controlled command unit, the device connected thereto by bus means and providing output signals from the transducers to a separate precision voltmeter means and the command unit, the device comprising:

bus interface means which translate bus commands into system commands for the device;

device microprocessor means which receive system commands from the bus interface means and provide output commands to channel selection means, bridge leg selection means and calibration resistor selection means, the microprocessor means also communicating with RAM means for temporary storage of system information and with ROM means which hold a system operating program;

calibration resistor selection means responsive to commands from the device microprocessor means which select one of a plurality of calibration resistors;

bridge leg selection means responsive to commands from the device microprocessor means which select one of the legs of one of the transducers to which the selected calibration resistor is applied in parallel;

channel selection means responsive to commands from the device microprocessor means which select one of the transducers for testing in conjunction with the loading means or in conjunction with calibration resistor and bridge leg selection means; and output means providing signals representing the response of the transducers to the loading means testing and to the calibration resistor testing such that all signals are uniquely identified to the particular transducer which produced the respective signals, such signals being supplied to the precision voltmeter means and to the operator controlled command unit.

2. The transducer of claim 1 wherein the channel selection means comprises a plurality of relay means and relay driver means responsive to microprocessor output commands which select a single transducer from the multiplicity of transducers.

3. The transducer multiplexer of claim 2 wherein the calibration resistor selection means comprises a plurality of relay means and relay driver means responsive to microprocessor output commands which act to connect a single calibration resistor to calibration resistor output line means.

4. The calibration resistor selection means of claim 3 wherein the selection means contains a plurality of calibration resistors of known resistance values which are identified to the transducer multiplexer.

5. The calibration resistor selection means of claim 4 wherein the selection means further comprises means to connect and select an external calibration resistor.

6. The transducer multiplexer of claim 3 wherein the bridge leg selection means comprises a plurality of relay means and relay driver means responsive to microprocessor output commands which connect the calibration resistor output line means, which are connected to the single calibration resistor, to the opposite ends of one of the legs of a single transducer.

7. The transducer multiplexer of claim 6 wherein the output means includes means to communicate the output voltage of each of the transducers, means to identify the known loads, means to identify the selected calibration resistors, means to identify the selected bridge legs, and means to identify the individual transducers.

8. The transducer multiplexer of claim 1 further comprising an internal programmable power supply to supply input voltage to the transducers.

9. The transducer multiplexer of claim 1 further comprising a manual command unit comprising a switch matrix to provide auxiliary manual control over the multiplexer functions.

* * * * *